United States Patent [19]

Morris

[11] Patent Number: 5,046,658

[45] Date of Patent: Sep. 10, 1991

[54] METHOD AND APPARATUS FOR SOLDERING ARTICLES

[75] Inventor: John R. Morris, Princeton Junction, N.J.

[73] Assignee: AT&T Bell Laboratories, Murray Hill, N.J.

[21] Appl. No.: 386,548

[22] Filed: Jul. 27, 1989

[51] Int. Cl.$^5$ .......................................... B23K 35/362
[52] U.S. Cl. ..................................... 228/206; 228/220
[58] Field of Search .................... 228/248, 180.2, 205, 228/206, 220, 223

[56] References Cited

U.S. PATENT DOCUMENTS

| | | | |
|---|---|---|---|
| 2,898,255 | 8/1959 | Thompson | 148/23 |
| 3,970,239 | 7/1976 | Hill | 228/220 |
| 4,022,371 | 5/1977 | Skarvinko et al. | 228/223 |
| 4,600,137 | 7/1986 | Comerford | 228/187 |
| 4,606,493 | 8/1986 | Christoph et al. | 228/180.1 |
| 4,739,920 | 4/1988 | Kujas | 228/223 |
| 4,771,929 | 9/1988 | Bahr et al. | 228/180.2 |

OTHER PUBLICATIONS

User Report, "Nitrogenius (Sic) Protective Gas Soldering System", Manufactured by SEHO, publication date believed to be approximately Oct. 1988.

*Primary Examiner*—Richard K. Seidel
*Assistant Examiner*—J. Miner
*Attorney, Agent, or Firm*—Robert B. Levy

[57] ABSTRACT

A technique is disclosed for achieving reduced residues on a circuit board (10) following soldering of each conductive member (18) of a component (20) to each corresponding metallized area (12) on the board. At the outset, a layer (22) of low solids solder paste is applied to the metallized areas (12) on the board. Thereafter, an acid is applied to the paste layers (22). Finally, the low solids paste is reflowed while the circuit board (10) is immersed in the inert atmosphere to bond the conductive members (18) of the component (20) to the metallized areas (12) on the circuit board (10).

6 Claims, 2 Drawing Sheets

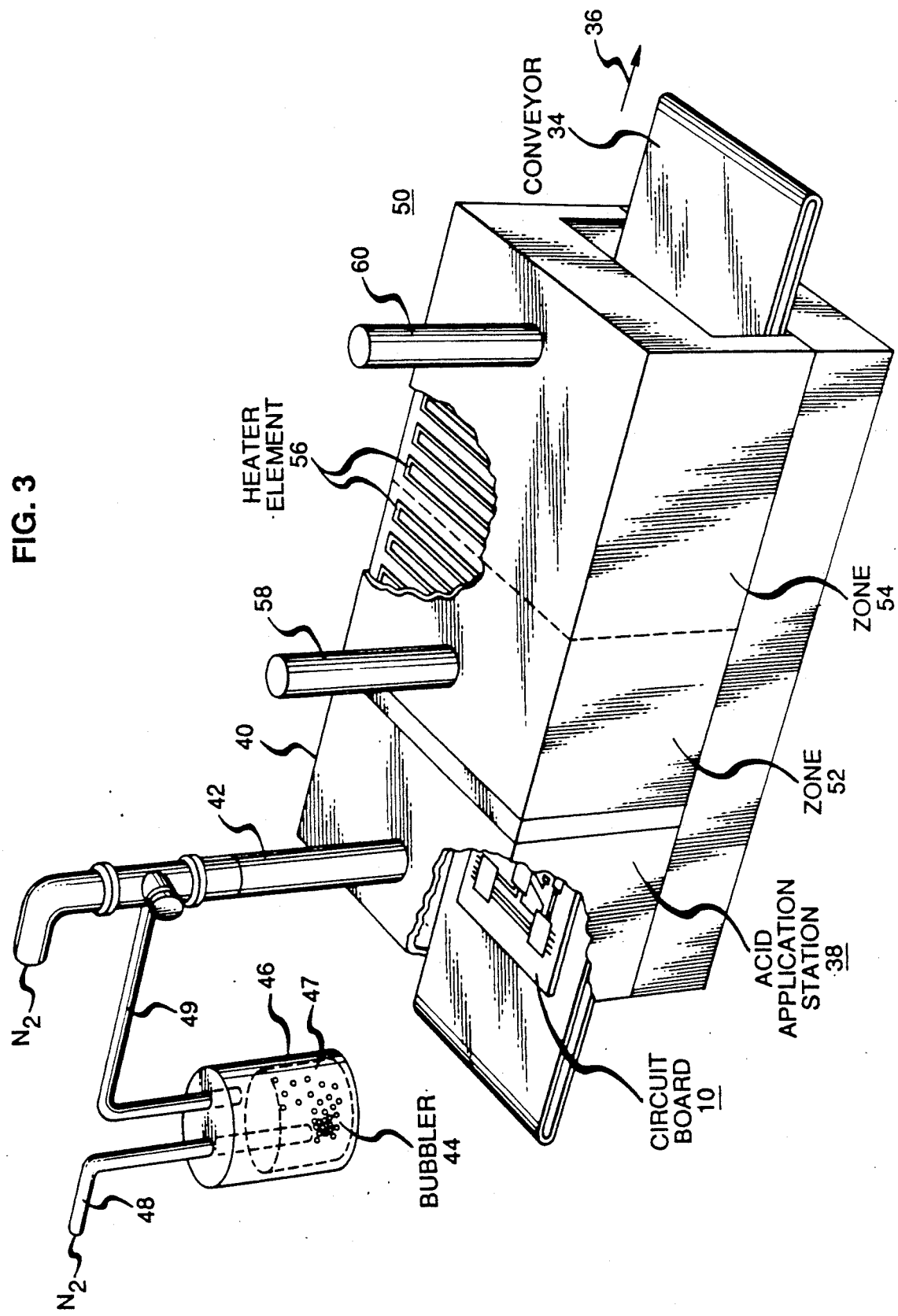

METHOD AND APPARATUS FOR SOLDERING ARTICLES

TECHNICAL FIELD

This invention relates to a method and apparatus for soldering articles, such as electronic components, to a substrate, such as a circuit board.

BACKGROUND OF THE INVENTION

Within the electronics industry, surface-mounted components, which are so named because they have conductive members adapted for soldering to metallized areas on the surface of a circuit board, are now becoming the components of choice. Such surface-mounted components are smaller in size than corresponding "through-hole" components, so named because they have leads designed for soldering to metal-plated through-holes in the circuit board. The reduced size of the surface-mounted components, as compared to their through-hole counterparts, permits a greater number of devices to be placed on a given-sized circuit board, allowing for increased functionality.

Presently, surface-mounted components are solder bonded to a circuit board by the following process. First, a layer of solder paste is applied to the metallized areas on the major surface(s) of the circuit board to which the conductive members of each surface-mounted component are to be soldered. Next, the surface-mounted components are placed on the circuit board so that each component has each of its conductive members in contact with a corresponding solder paste-coated metallized area. The paste is generally tacky and serves to hold the conductive members of the component to the metallized areas on the board. After the paste is applied and the components have been placed, the paste is rendered molten, that is, reflowed, typically by heating the circuit board in an oven designed for that purpose.

Most of the solder pastes now in commercial use contain rosin and other organic constituents which act as flux to wet the metallized areas during soldering. Invariably, when the solder paste is reflowed, the rosin and other organic constituents in the paste leave a residue on the circuit board. Depending on the type of solder paste used, these residues can be detrimental to the operation of the board. Moreover, the residues do adversely impact the ability to test the board and detract from its overall appearance as well. For these reasons, many manufacturers clean each circuit board after soldering to remove whatever residues remain.

Typically, the only way to clean the residues remaining on each circuit board after soldering is to use a very aggressive de-fluxing solvent, such as a detergent, a chlorinated solvent, or a chlorofluorocarbon (CFC). Spent detergents usually require treatment before discharge into a municipal sewer system, which raises production costs, while chlorinated solvents and CFC's have been shown to be detrimental to the environment. More recently, a terpene-based de-fluxing solvent has been developed which may be used to dissolve rosin-based residues on a circuit board. While many of the problems incurred with using detergents, chlorinated solvents and CFC's are eliminated by using a terpene-based de-fluxing solvent, there are other problems associated with use of such solvents to clean circuit boards containing surface-mounted components.

Residues also tend to remain on circuit boards containing through-hole components after the components are wave soldered to the board because rosin-based fluxes are commonly applied to the components prior to soldering. One proposal to reduce the residues remaining on circuit boards following wave soldering is to flux the component leads with a low solids flux which contains a reduced volume of rosin and organic constituents. After the components have been fluxed with the low solids flux, the components are wave soldered to the board in an inert atmosphere (typically nitrogen) within which a reducing agent (i.e., hydrogen, or an acid) is added to enhance the action of the flux. The combination of the inert atmosphere and the reducing agent has been alleged to greatly reduce the residues remaining after soldering. However, wave soldering is generally not suited for soldering surface-mounted components which have a large number of leads.

Thus, there is a need for a technique for soldering surface-mounted components to a circuit board so as to achieve reduced rosin residues on the board.

SUMMARY OF THE INVENTION

Briefly, in accordance with a preferred embodiment of the invention, a method is provided for soldering an article, such as a component, to a surface of an object, such as a circuit board, so that the volume of residues remaining on the board after soldering is reduced. The method is initiated by applying a low solids solder paste, containing a reduced volume of rosin, to those areas on the object to which an article is to be soldered. The article is then placed on the solder paste-coated areas on the object. Thereafter, an acid is applied to, and mixed with, the paste. The low solids solder paste is then reflowed, while the object and article are immersed in an inert atmosphere, to bond the article to the surface of the object. The application of a low solids solder paste, the subsequent application of acid, and then the reflow of the solder paste in an inert environment, has empirically been found to reduce the volume of residues remaining after reflow of the paste. as compared to conventional reflow soldering processes.

BRIEF DESCRIPTION OF THE DRAWING

FIG. 3 is a perspective view of an apparatus, in accordance with the invention, for carrying out several of the steps of the soldering method of FIG. 2.

DETAILED DESCRIPTION

Figure 1:
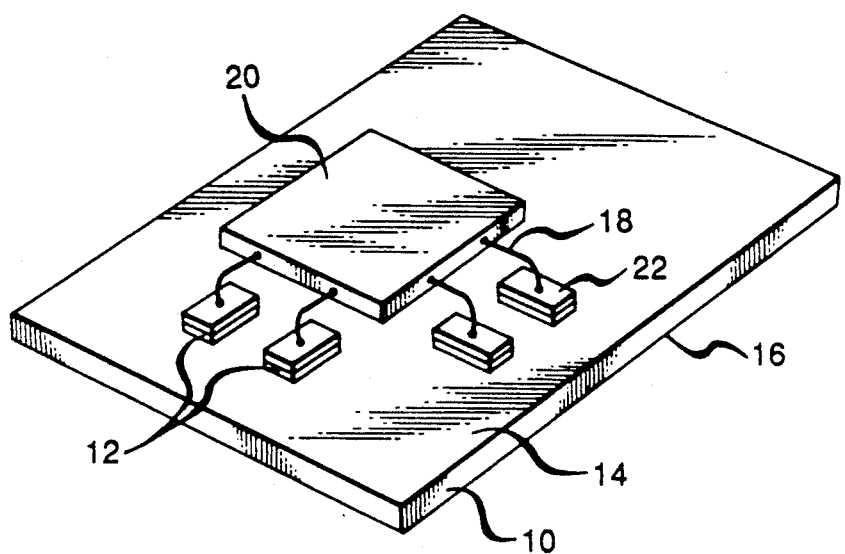
FIG. 1 is a perspective view of a prior art circuit board showing a surface-mounted component mounted on its surface.

FIG. 1 is a perspective view of a conventional (prior art) circuit board 10, as is commonly found in the electronic industry. The circuit board 10, which is typically made from a material such as epoxy, is provided with a pattern of metallized areas 12 on one or both of its major surfaces 14 and 16. The pattern of metallized areas 12 corresponds exactly to the pattern of conductive members 18 of a surface-mounted component 20 to be soldered to the board. In the embodiment shown in FIG. 1, only one set of patterns 12 and one component 20 have been shown for simplicity purposes. In practice, the circuit board 10 will have a plurality of patterns 12 of metallized areas, to accommodate a large number of components 20.

The conductive members 18 of the surface-mounted component 20 are usually solder bonded to the metallized areas 12 on the circuit board 10 by the following process. First, the metallized areas 12 are coated with a layer 22 of solder paste, typically an RMA-(rosin, mildly activated) type paste comprised of a solder alloy, rosin, a solvent, an activator and one or more rheology-modifying agents. Such RMA-type solder pastes are commercially available from a large number of vendors. In practice, the layer 22 of paste is obtained by screen or stencil printing the paste in a well-known manner, such as by using a squeegee or, more recently, by using the print head (not shown) disclosed in U.S. Pat. No. 4,622,239, issued on Nov. 11, 1986, to D. Schoenthaler and T. Wojcik, and assigned to AT&T Technologies.

Following application of the layer 22 of paste to the metallized areas 12, the component 20 is placed on the circuit board 10 such that each conductive member 18 rests on, or penetrates, the paste layer overlying a corresponding one of the metallized areas 12. The layer 22 of paste overlying each metallized area 12 is tacky, and serves to adhere a separate one of the conductive members 18 to the metallized layer therebeneath. Once the component 20 has been placed on the circuit board 10 in this fashion, the layer 22 of solder paste on the metallized areas 12 is reflowed, typically by heating the board in an oven (not shown) designed for this purpose.

Figure 2:
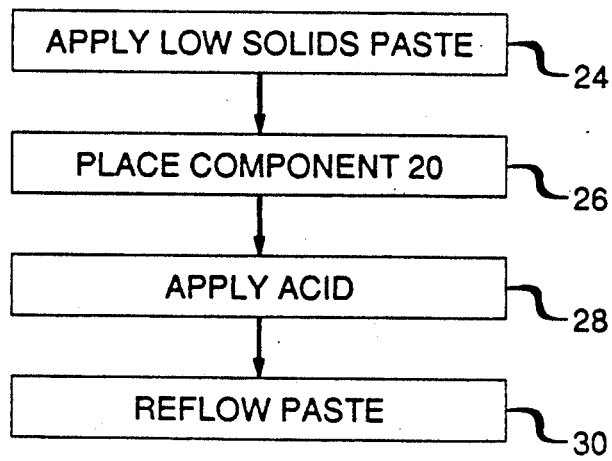
FIG. 2 is a flow chart diagram of the soldering process of the present invention.

The soldering process thus described invariably produces residues which remain in the circuit board following reflow of the paste layer 22. Many manufacturers require that the residues be cleaned from the circuit board 10, resulting in increased production costs. Referring to FIG. 2, there is shown a flowchart of a new soldering process, in accordance with the invention, which has been found to achieve much reduced residues, thereby eliminating the need for post-solder cleaning of the circuit board 10.

The soldering process of FIG. 2 is initiated (step 24) by applying a layer 22 of a low solids-type solder paste to the pattern of metallized areas 12 in place of the conventional RMA-type paste used in the past. Low solids pastes, an example of which is Multicore type X-32, available from Multicore, Hertfordshire, England, contain a reduced amount of dissolved solids, such as rosin, as compared to conventional RMA-type pastes.

After application of the low solids paste during step 24, the component 20 of FIG. 1 is placed on the circuit board 10 such that each conductive member 18 rests on or penetrates the layer 22 of low solids paste overlying a corresponding metallized layer 12 (step 26). The placement of the component 20 on the circuit board 10 is typically carried out by a component-placement machine (not shown) as are well known in the art.

Following placement of the component 20 during step 26 of FIG. 2, an acid, typically formic acid or acetic acid, is applied to, for mixing with, the layer 22 of low solids paste on the circuit board 10 (step 28). It is desirable to apply the acid to the circuit board 10 while the board is situated in an inert atmosphere so as to reduce the likelihood that the metallized areas 12, as well as the metal constituents in the solder paste, will oxidize. However, the acid can be applied to the circuit board 10 in an ambient environment without adverse effects.

The last step (step 30) in the process is to reflow the layer 22 of low solids paste, typically, by heating the circuit board 10, in order to bond the conductive members 18 of FIG. 1 to the metallized areas 12 of FIG. 1 (step 30). It is important to reflow the solder paste while the circuit board 10 is immersed an inert atmosphere to reduce the extent of oxidation. The exact manner in which steps 28 and 30 are carried out will be explained in greater detail with respect to FIG. 3.

The purpose in applying the acid to the layer 22 of low solids paste on each metallized area 12 is to chemically reduce the metal oxides present in the metallized area itself and in the solder paste. These metal oxides are chemically described by the formula MeO, where the term Me is used to generically describe the various metals which are present. When formic acid (whose chemical formula is HCOOH) is applied to the layer 22 of solder paste on each metallized area 12, at a temperature below 200° C., the following reaction is believed to occur:

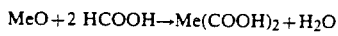
$$MeO + 2\ HCOOH \rightarrow Me(COOH)_2 + H_2O$$

When the circuit board is heated during step 30 to a temperature in excess of 200° C. to reflow the low solids paste, the following reaction is believed to occur:

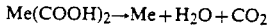
$$Me(COOH)_2 \rightarrow Me + H_2O + CO_2$$

As a consequence, each of the various metal oxides, represented generically by the formula MeO, is reduced to its individual metal (Me), which greatly enhances the quality of the solder bond between the conductive members 18 and the metallized areas 12 of FIG. 1. The reason for carrying out the steps of applying the acid (step 28) and reflowing the layers 22 of low solids paste (step 30), in an inert atmosphere, is to eliminate the possibility that the metals (Me) will re-oxidize, as might occur if large volumes of air (oxygen) were present. As previously indicated, the acid application step (step 28), while typically carried out in an inert environment, can be carried out in an ambient environment. In practice, the acid application step is carried out at temperatures no greater than 50° C. so the amount of oxidation is small. Hence, carrying out the acid application step in an inert environment is desirable but not critical.

In addition to reducing the metal oxides MeO to their individual metals Me, there was a significant unexpected advantage obtained by applying the acid to the circuit board 10 and then by heating the board in an inert atmosphere. As compared to a circuit board 10 soldered in a conventional manner using the RMA-type solder paste, the level of residues on the remaining boards boards soldered in accordance with the method of FIG. 2 was found to be much lower. In fact, the level of solder residues remaining was found to be lower than would be expected when using a low solids paste and then reflowing the paste in either air or nitrogen. The residues remaining were found to be low enough so that the testability of the circuit board 10 and its and cosmetic appearance were sufficiently good that cleaning could be eliminated. No degradation of the surface insulation resistance was found either.

Referring to FIG. 3, there is shown an apparatus 32 for applying acid to the layer 22 (see FIG. 1) of low solids solder paste on the circuit board 10 and then reflowing the solder paste while the board is subjected to an inert atmosphere. As seen in FIG. 3, the apparatus 32 includes a conveyor 34, as is well known in the art, for carrying the circuit board 10 along a path 36. The conveyor 34 passes through an acid application station 38 which is so named because at this station, an acid (typically formic or acetic acid) is applied to, to react with, the solder paste on the circuit board 10. In a preferred embodiment, the station 38 is comprised of a box-like chamber 40, fabricated from an acid-resistant material, such as stainless steel. The chamber 40 is substantially closed, with the exception of entry and exit ports (not shown) in each of its front and back ends so the conveyor 34 may extend through the chamber. A gas delivery tube 42 serves to carry an inert gas, typically nitrogen, from a gas supply (not shown) into the chamber 40 so that the atmosphere in the chamber surrounding the circuit board 10 carried through the chamber on the conveyor 34, is substantially oxygen-free.

In practice, the acid is mixed with the solder paste on the circuit board 10 by providing a bubbler 44 to bubble the acid into the stream of nitrogen carried by the tube 42 in the chamber. As shown schematically in FIG. 3, the bubbler 44 comprises a re-sealable vessel 46 into which a volume 47 of formic or acetic acid has been added. An inert gas (typically nitrogen) is directed into the vessel 46 below the level of the acid through a tube 48. An exhaust passage 49 communicates with the vessel 46 above the level of the acid to carry the acid vapor, produced when the inert gas is bubbled through the acid, to the tube 42 so the acid vapor is injected into the nitrogen carried in the tube. Instead of injecting the acid vapor into the nitrogen admitted into the chamber 40, the acid could be sprayed on the circuit board 10 by forcing the acid through a set of spray jets (not shown) directed at the board. Alternatively, the acid could be applied by passing the circuit board 10 over an acid bath (not shown).

Immediately downstream of the chamber 40 is an over 50 for heating circuit boards passing therethrough on the conveyor 34 to reflow the layer 22 of low solids paste (see FIG. 1) on the board. The oven 50, which has a box-like structure, is comprised of at least two zones 52 and 54, each containing a set of heating elements 56 (typically lamps or infra-red panels). The heating elements 56 in the first zone 52, which is located immediately downstream of the chamber 40, typically heat the circuit board 10 to a relatively low temperature (e.g., to 100° C.). In contrast, the heating elements 56 in the zone 54 heat the circuit board 10 to a high temperature, on the order of 200° C., to reflow the layer 22 of low solids solder paste on the board. As may be appreciated, the heating elements 56 in the zone 52 act to "pre-heat" the circuit board 10, thereby reducing the thermal shock experienced by the board once it enters the second zone 54 where the solder paste is reflowed. An additional advantage of passing the circuit board 10 through the zone 52 prior to the zone 54 is to allow the flux in the solder paste sufficient time to reduce the oxides which are present. In practice, the zones 52 and 54 are often referred to as the preheat and reflow zones, respectively.

As described, the over 50 is conventional in its construction. What distinguishes the over 50 from its commercially available counterparts is that each of a pair of gas delivery tubes 58 and 60 extend into the interior of the zones 52 and 54, and carry nitrogen to each to displace the oxygen in each zone. In this way, when the circuit board 10 passes through the pre-heat and reflow zones 52 and 54, respectively, the board is subjected to an inert atmosphere.

Rather than apply the acid to the circuit board 10 within the chamber 40 upstream of the oven 50, the acid could be applied within the pre-heat zone 52 of the oven itself, by connecting the bubbler 44 to the tube 58, rather than the tube 42. In this way, the need for the chamber 40, and its associated gas delivery tube 42, would be obviated.

While it might seem more desirable to inject the acid directly into the nitrogen admitted into the pre-heat zone 52, thereby obviating the need for the acid application station 38, there is a distinct disadvantage in doing so. By its very nature, the acid applied to the low solids paste on the circuit board 10 is corrosive, and for this reason it is desirable apply the acid no earlier than just before the reflow operation. However, were the acid to be admitted into the pre-heat zone 52, it is likely that the oven 50 would prematurely corrode. In fact, even when the acid is mixed with the low solids solder paste prior to passage of the circuit board 10 into the pre-heat zone 52, some corrosion nonetheless results, due to some of the unmixed acid being vaporized during paste reflow. However, the amount of corrosion caused is small compared to the corrosion that would occur if the acid were applied to, and mixed with, the low solids paste during pre-heating of the circuitry board 10 within the pre-heat zone 52.

By applying the acid within the chamber 40, rather than in within the preheat zone 52, it is the chamber rather than the oven 50 which will likely experience the greater corrosion. Typically, the fabrication cost of the chamber 40 is much smaller than that of the oven 50 so that it is desirable to apply the acid within the chamber in order to extend the life of the oven.

The foregoing describes an technique for achieving reduced rosin residues on a circuit board 10 to which a surface-mounted component 20 is reflow soldered. By first applying a low solids paste to the circuit board 10, then adding acid to the paste in an inert atmosphere, and thereafter reflowing the paste in an inert atmosphere, a reduced volume of residues remains after soldering.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for fabricating an object by soldering at least one article to a metallized area on a major surface of the object with a reduced incidence of solder residues comprising the steps of:
   applying a low solids, rosin containing soldering paste to a metallized area on a major surface of an object;
   placing an article on the solder paste-coated metallized area;
   applying an acid to the solder paste;
   subjecting the object to a substantially inert atmosphere; and
   reflowing the acid-treated solder paste on the object while the object and article are subjected to the inert atmosphere to bond the object to the article with reduced incidence of solder paste residues.

2. The method according to claim 1 wherein the acid is applied to the paste by bubbling the acid into a gas directed at the object.

3. The method according to claim 2 wherein the acid is bubbled through an inert gas which is directed to surround the object.

4. The method according to claim 1 wherein the steps of applying the acid and reflowing the solder paste are performed simultaneously.

5. The method according to claim 1 wherein the step of applying the acid to the low solids paste is performed prior to reflowing the paste.

6. The method according to claim 1 wherein the low solids solder paste is printed on each metallized area on the object.

* * * * *